(12) United States Patent
Sunohara et al.

(10) Patent No.: US 7,134,195 B2
(45) Date of Patent: Nov. 14, 2006

(54) METHOD OF PRODUCTION OF MULTILAYER CIRCUIT BOARD WITH BUILT-IN SEMICONDUCTOR CHIP

(75) Inventors: Masahiro Sunohara, Nagano (JP); Kei Murayama, Nagano (JP); Mitsutoshi Higashi, Nagano (JP)

(73) Assignee: Shinko Electric Indutries Co., Ltd., Nagano (JP)

( * ) Notice: Subject to any disclaimer, the term of this patent is extended or adjusted under 35 U.S.C. 154(b) by 165 days.

(21) Appl. No.: 10/796,004

(22) Filed: Mar. 10, 2004

(65) Prior Publication Data

US 2004/0188136 A1   Sep. 30, 2004

(30) Foreign Application Priority Data

Mar. 26, 2003   (JP)   .............................. 2003-085829

(51) Int. Cl.
  *H05K 3/30*   (2006.01)
  *H05K 3/02*   (2006.01)
  *H05K 3/10*   (2006.01)

(52) U.S. Cl. ........................... 29/832; 29/841; 29/846; 174/259; 257/758; 361/664; 438/459

(58) Field of Classification Search ................. 29/412, 29/416, 830–832, 834, 841, 846, 847, 852; 174/250, 259; 361/760–766; 438/64, 118, 438/456, 459, 613, 620, 622, 188; 257/686, 257/698, 700, 758, 777
See application file for complete search history.

(56) References Cited

U.S. PATENT DOCUMENTS 4,791,239 A  * 12/1988  Shirahata et al. ........... 174/258
5,353,498 A  * 10/1994  Fillion et al. ................. 29/840
5,362,926 A  * 11/1994  Fukuda et al. .............. 174/256
6,090,696 A     7/2000  Jang et al.
6,184,064 B1 *  2/2001  Jiang et al. ................. 438/459
6,288,451 B1 *  9/2001  Tsao ........................... 257/778
6,316,292 B1   11/2001  King et al.
6,445,060 B1    9/2002  Courtenay et al.
6,558,975 B1 *  5/2003  Sugino et al. ................ 438/64
2001/0008794 A1  7/2001  Akagawa

OTHER PUBLICATIONS

L. J. Matienzo et al., "Adhesion Issues in Electronic Packaging," Solid State Technology, Cowan Publ. Corp., vol. 38, No. 7, Jul. 1995, pp. 99-100; 102-105.
European Search Report and Annex date Oct. 25, 2005 of EP 04 25 1460.

* cited by examiner

*Primary Examiner*—Minh Trinh
*Assistant Examiner*—Donghai D. Nguyen
(74) *Attorney, Agent, or Firm*—Staas & Halsey LLP

(57) ABSTRACT

A method of production of a multilayer circuit board comprised of a multilayer structure circuit formed by a plurality of interconnect layers and insulation layers stacked together and a semiconductor chip included therein, including the steps of placing a semiconductor chip having a polished back surface, with its active surface facing downward, on an already formed lower interconnect layer and forming an insulation layer over the layer on which the semiconductor chip has been placed, the method further including the step of treating the polished back surface of the semiconductor chip to improve its bondability with the insulation layer before the step for formation of the insulation layer.

1 Claim, 11 Drawing Sheets

METHOD OF PRODUCTION OF MULTILAYER CIRCUIT BOARD WITH BUILT-IN SEMICONDUCTOR CHIP

BACKGROUND OF THE INVENTION

1. Field of the Invention

The present invention relates to a method of production of a multilayer circuit board comprised of a multilayer structure circuit formed by a plurality of interconnect layers and insulation layers stacked together and a semiconductor chip included therein.

2. Description of the Related Art

Multilayer circuit boards with built-in semiconductor chips are being widely used as thin boards. The built-in semiconductor chips have to be made as thin as possible in order for them to fit in the limited board thickness. As means for this, the practice has been to polish the back surfaces so as to reduce the thickness of the semiconductor chips (for example, see US 2001/0008794A1, [00103] to [0110]). Such a semiconductor chip polished on its back surface, however, creates the following problem in the process of production of a multilayer circuit board.

That is, when placing the semiconductor chip to be built in, with its active surface facing down, on a lower interconnect layer and then forming an insulating film over it, sometimes the smoothly polished back surface will have insufficient bondability with the insulating film laid over it. As a result, when performing reflow as part of the process of production of the multilayer circuit board or running an environment test as a test of the finished multilayer circuit board, the problem has arisen of the insulating film ending up being peeled off from the semiconductor chip due to the shrinkage stress of the resin.

SUMMARY OF THE INVENTION

An object of the present invention is to provide a method of production of a multilayer circuit board incorporating a semiconductor chip which enhances the bondability between a semiconductor chip with a smoothly polished back surface and an insulating film forming an insulation layer.

To attain the above object, according to the present invention, there is provided a method of production of a multilayer circuit board comprised of a multilayer structure circuit formed by a plurality of interconnect layers and insulation layers stacked together and a semiconductor chip included therein, including the steps of placing a semiconductor chip having a polished back surface, with its active surface facing downward, on an already formed lower interconnect layer and forming an insulation layer over the layer on which the semiconductor chip has been placed, the method further including the step of treating the polished back surface of the semiconductor chip to improve its bondability with the insulation layer before the step for formation of the insulation layer.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1A:
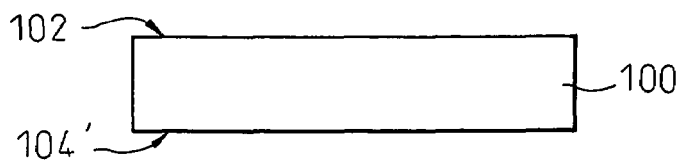
FIGS. 1A to 1H are cross-sectional views showing an example of the procedure for treatment for improving bondability by coating the back surface of a semiconductor chip by a coupling agent according to a first embodiment of the present invention.

Preferred embodiments of the present invention will be described in detail below while referring to the attached figures.

The treatment for improving the bondability can be performed by any of the following (1) to (4). Note that in the present invention, the semiconductor chip is generally a silicon chip.

(1) Coating the back surface of the semiconductor chip by a coupling agent before or after the placement step: The coupling agent has the action of increasing the chemical bonding force between the semiconductor chip and the insulating film. Typically, a silane-based, titanate-based, aluminum-based, or other material can be used. It is possible to perform the treatment when polishing the back surface in the state with the formation of a large number of semiconductor chips in a wafer and then perform the dicing. As another example, it is possible to perform the treatment after placing a semiconductor chip on a lower interconnect layer. The method of treatment allows the timing of treatment to be selected and is inexpensive.

(2) Formation of a bonding layer at the back surface of the semiconductor chip before the placement step: The bonding layer is comprised of a material having bondability with both of the semiconductor chip and the insulating film. Typically, it is formed by adhering or coating a diattach film (epoxy-based), dicing tape bonding material (acrylic-based), or polyimide resin (liquid or film state). These can be applied by materials and facilities which have been used in the past.

(3) Roughening of the back surface of the semiconductor chip before the placement step: The roughening is performed by wet etching or dry etching. The wet etching can be performed by $HF/HNO_3$ etc., while the dry etching can be performed by $SF_6$, $CF_4$, $Cl_2$, etc. Plasma etching and remote plasma are also possible. According to this treatment, the mechanical bonding force is enhanced by the anchor action of the roughened surface. Since the back surface is not given any other additional layer, the thickness of the semiconductor chip made thinner by the polishing is never increased.

(4) Formation of a metal film on the back surface of the semiconductor chip, then roughening the surface of the metal film before the placement step: Sputtering, electroless plating, etc. is used to form a Cu, Ni, Au, Al, or other metal film and then plasma treatment, permanganic acid wet treatment, etc. is used to roughen the surface of the metal film. Roughening of the metal film is easier than roughening of a semiconductor. The mechanical bonding force is enhanced by the anchor action of the roughened surface. Further, as a secondary action, the heat dissipating ability of the semiconductor chip is enhanced by the heat conduction of the metal film.

The treatment for improvement of the bondability can all be executed by the facilities and materials used in the past, so a lot of time and cost are not required for development.

First Embodiment

Referring to FIGS. 1A to 1H, an explanation will be made of an example of coating a coupling agent on the back surface of a semiconductor chip according to a first embodiment of the present invention.

A silicon wafer 100 shown in FIG. 1A is formed with a large number of semiconductor chips at its semiconductor chip forming surface 102. The wafer 100 is for example a thickness of 725 µm or so.

Figure 1B:
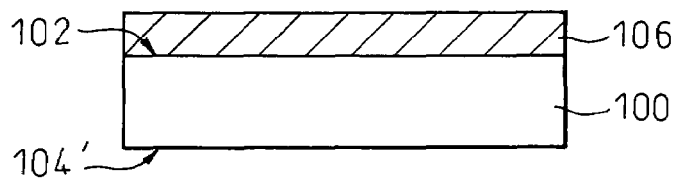

As shown in FIG. 1B, a surface protective tape 106 is adhered to the semiconductor chip formation surface 102. This is performed using a laminator at ordinary temperature by rolling.

Figure 1C:
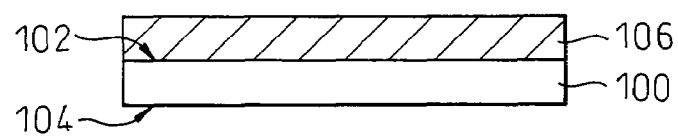

As shown in FIG. 1C, the back surface 104' of the silicon wafer 100 is polished to obtain the polished back surface 104. This polishing is performed using a back grinder at 4000 rpm at 1 µm/sec. The thickness of the wafer 100 is reduced to about 20 to 100 µm or so.

Figure 1D:
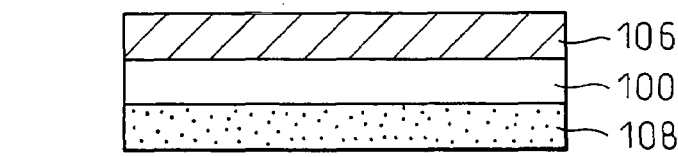

As shown in FIG. 1D, the characterizing feature of the first embodiment of the present invention is the formation of the layer 108 of the coupling agent on the polished back surface 104. As an example, this is performed by dipping in a dispersion comprised of a silane-based coupling agent dispersed in an IPA aqueous solution.

Figure 1E:
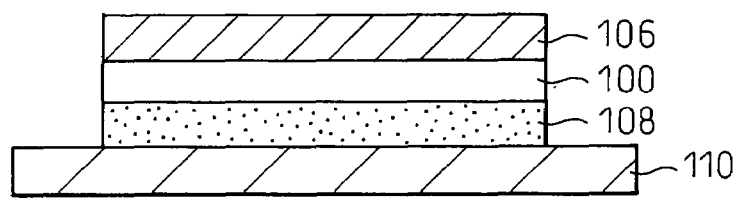

As shown in FIG. 1E, a dicing tape 110 is adhered on the layer 108 of the coupling agent. This is performed by a laminator at ordinary temperature by rolling.

Figure 1F:
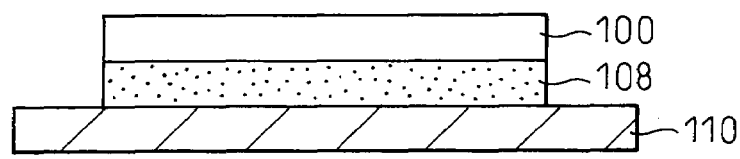

As shown in FIG. 1F, the surface protective tape 106 is removed. This is performed by peeling using a tape remover.

Figure 1G:
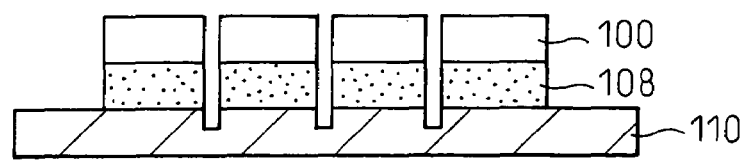

As shown in FIG. 1G, the wafer is diced to cut it into individual semiconductor chips. This cutting is performed using a dicer at a dicing blade speed of 40,000 rpm and cutting speed of 50 mm/sec.

Figure 1H:
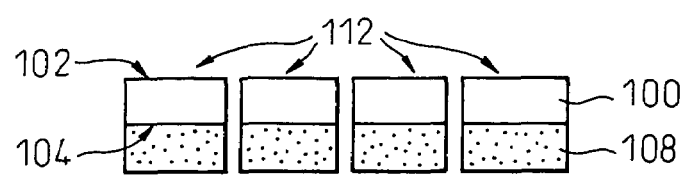

As shown in FIG. 1H, each diced semiconductor chip 112 has an active surface 102 and a back surface 104. The back surface 104 is formed with a layer 108 of the coupling agent.

Note that in this example, a silane-based coupling agent was used, but there is no need to limit the invention to this. Any material having an action increasing the chemical bonding force between a semiconductor chip and insulating film may be used. In addition to a silane-based one, a titanate-based, aluminum-based, or other material may be used.

Regarding the timing of treatment by the coupling agent, as in the present embodiment, it is possible to polish the back surface in the state with a large number of semiconductor chips formed at the wafer, treat it by a coupling agent in that state, then dice the wafer. As another treatment timing, it is possible to place a semiconductor chip on a lower interconnect layer, then treat it by a coupling agent.

The method of treatment by a coupling agent has the advantages that it enables the timing of treatment to be selected and is low in cost.

Second Embodiment

Next, an explanation will be made of an example of bonding a bonding film on the back surface of a semiconductor chip according to a second embodiment of the present invention.

Figure 2A:
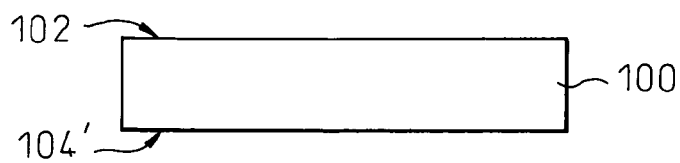
FIGS. 2A to 2H are cross-sectional views showing an example of the procedure for treatment for improving bondability by forming a bonding layer on the back surface of a semiconductor chip according to a second embodiment of the present invention.
Figure 2B:
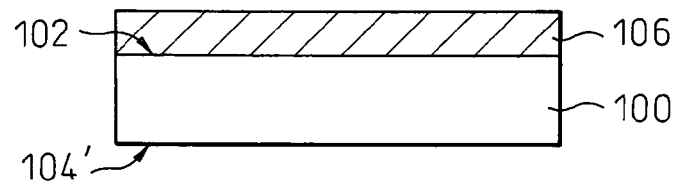
Figure 2C:
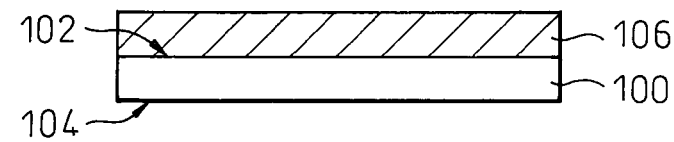

In the same way as the steps of FIG. 1A to FIG. 1C of the first embodiment, the steps of FIG. 2A to FIG. 2C are performed to polish the back surface 104' of the silicon wafer 100 to the polished back surface 104.

Figure 2D:
Figure 2E:
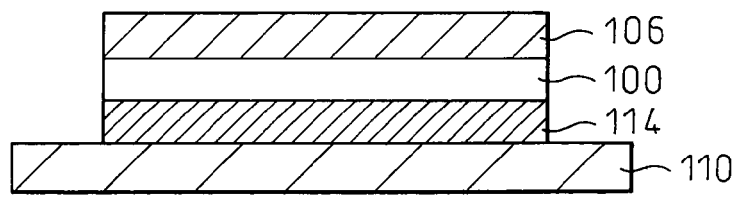
Figure 2F:
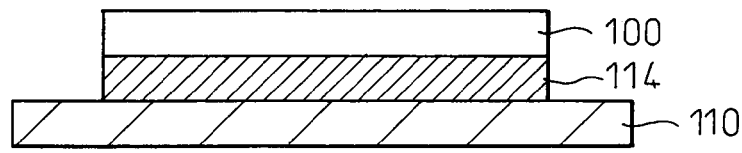
Figure 2G:
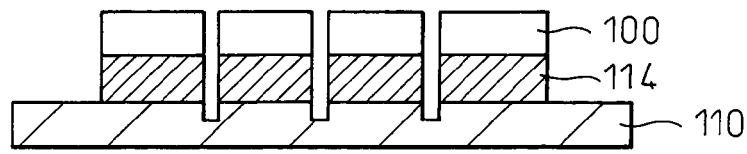
Figure 2H:
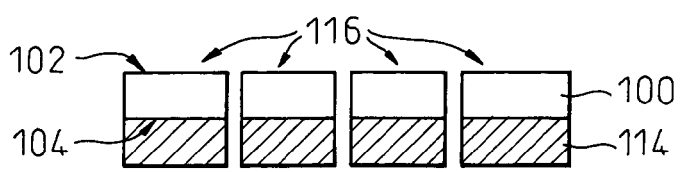

Next, as shown in FIG. 2D, the second embodiment of the present invention is characterized by bonding a bonding film 114 on the polished back surface 104. This is performed for example by using a laminator to bond a die attach film (thickness 25 µm) comprised of an epoxy-based curing resin under conditions of a heating temperature of 140° C., a heating time of 10 sec, and a pressing force of 1 MPa.

After this, in the same way as the steps of FIG. 1E to FIG. 1H of the first embodiment, the steps of FIG. 2E to FIG. 2H are performed. Each diced semiconductor chip 116 has an active surface 102 and a back surface 104. A bonding film 114 is bonded to the back surface 104.

Note that in the present embodiment, an epoxy-based bonding film 114 was used, but the invention does not have to be limited to it. Any material having bondability with respect to both a semiconductor chip and insulating film is possible. Typically, in addition to the die attach film used in the present embodiment (epoxy-based), it is formed by bonding or coating a dicing tape bonding material (acrylic-based) and polyimide resin (liquid or film state). Both can be executed by materials and facilities used since the past.

Third Embodiment

Next, an explanation will be made of an example of roughening a polished back surface of a silicon chip according to a third embodiment of the present invention.

Figure 3A:
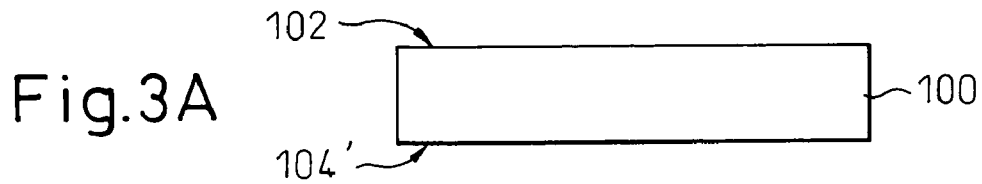
FIGS. 3A to 3H are cross-sectional views showing an example of the procedure for treatment for improving bondability by roughening the back surface of a semiconductor chip according to a third embodiment of the present invention.
Figure 3B:
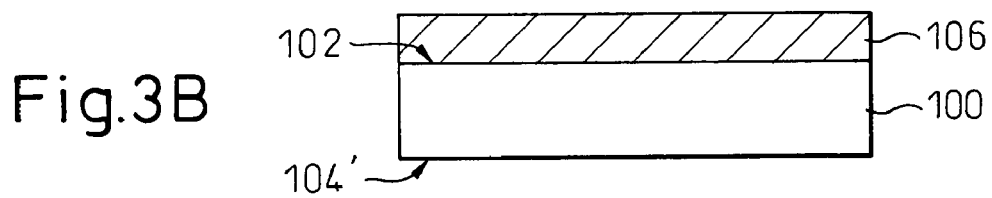
Figure 3C:
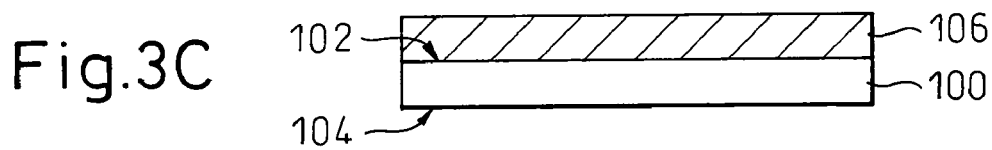

In the same way as the steps of FIG. 1A to FIG. 1C of the first embodiment, the steps of FIG. 3A to FIG. 3C are performed to polish the back surface 104' of the silicon wafer 100 to the polished back surface 104.

Figure 3D:
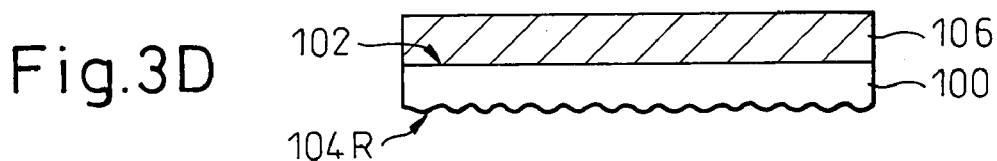
Figure 3E:
Figure 3F:
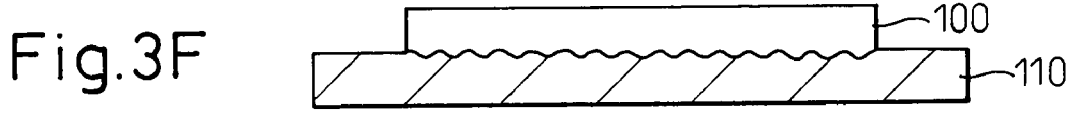
Figure 3G:
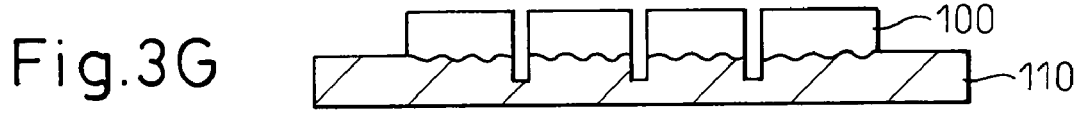
Figure 3H:
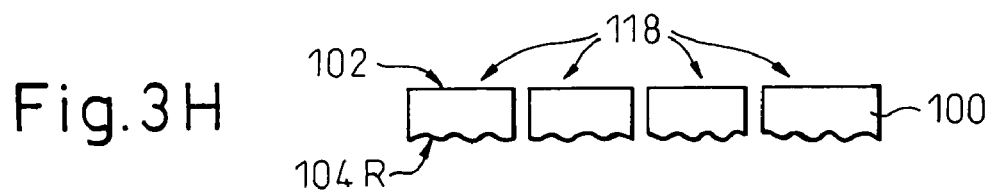

Next, as shown in FIG. 3D, the third embodiment of the present invention is characterized by roughening the polished back surface 104 to obtain the roughened back surface 104R. This is performed for example by using a plasma etcher for isotropic dry etching by an $SF_6/Ar$ mixed gas under conditions of a gas pressure of 100 Pa to give a roughness of 0.1 µm.

After this, in the same way as the steps of FIG. 1E to FIG. 1H of the first embodiment, the steps of FIG. 3E to FIG. 3H are performed. Each diced semiconductor chip 118 has an active surface 102 and a back surface 104R. The back surface 104R is roughened.

Note that in the present embodiment, the means for roughening the back surface of the silicon chip was isotropic dry etching, but the invention does not have to be limited to it. The roughening may also be performed by wet etching or dry etching. The wet etching can be performed by $HF/HNO_3$ etc., while the dry etching can be performed by $SF_6$, $CF_4$, $Cl_2$, etc. Plasma etching and remote plasma are also possible.

The roughening treatment enhances the mechanical bonding force due to the anchor action of the roughened surface.

Since the back surface is not given any other additional layer, the thickness of the semiconductor chip made thinner by the polishing is never increased.

Fourth Embodiment

Next, an explanation will be made of an example of forming a metal film on a polished back surface of a silicon chip and roughening the surface of the metal film according to a fourth embodiment of the present invention.

Figure 4A:
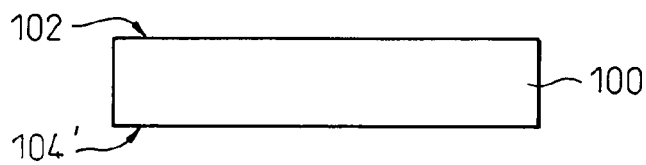
FIGS. 4A to 4I are cross-sectional views showing an example of the procedure for treatment for improving bondability by forming a metal layer on the back surface of a semiconductor chip, then roughening the surface of that metal layer according to a fourth embodiment of the present invention.
Figure 4B:
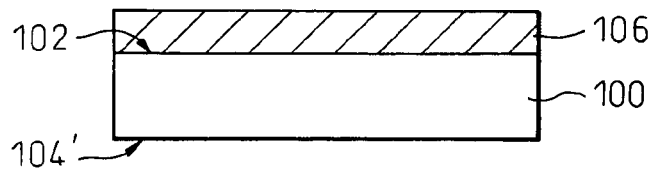
Figure 4C:
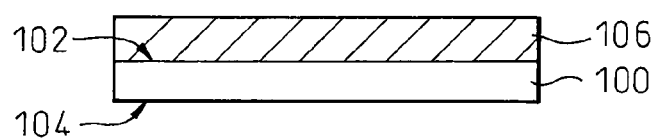

In the same way as the steps of FIG. 1A to FIG. 1C of the first embodiment, the steps of FIG. 4A to FIG. 4C are performed to polish the back surface 104' of the silicon wafer 100 to the polished back surface 104.

Figure 4D:
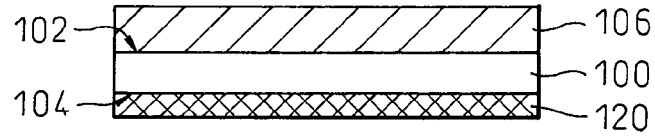

Next, as shown in FIG. 4D, the fourth embodiment of the present invention is characterized by forming a metal film 120 comprised of Cu on the polished back surface 104 using a sputtering apparatus under conditions of a vacuum of $10^{-4}$ Pa, a sputtering output of 500 W, and a substrate temperature of 70° C.

Figure 4E:
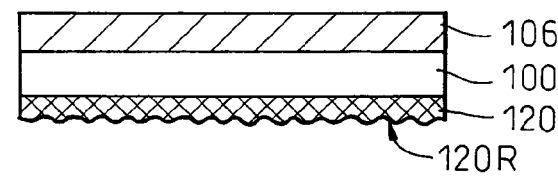
Figure 4F:
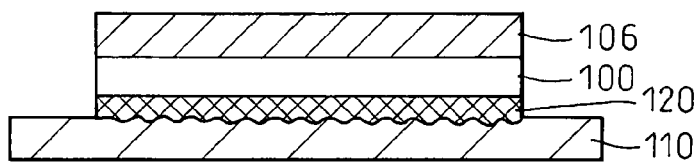
Figure 4G:
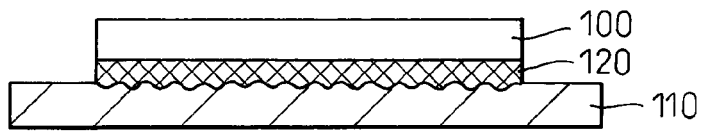
Figure 4H:
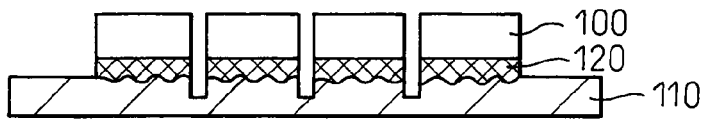
Figure 4I:
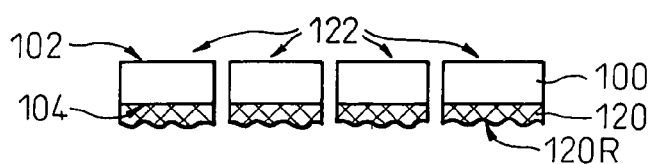

Next, as shown in FIG. 4E, the surface of the Cu metal film 120 is roughened to obtain the roughened surface 120R. This is performed for example by dipping in 80° C. potassium permanganate.

After this, in the same way as the steps of FIG. 1E to FIG. 1H of the first embodiment, the steps of FIG. 4F to FIG. 4I are performed. Each diced semiconductor chip 122 has an active surface 102 and a back surface 104. The surface of the Cu metal film 120 formed on the back surface 104 is roughened to form the surface 120R.

Note that in the present embodiment, the metal film was formed by sputtering, but the invention does not have to be limited to it. Electroless plating or another metal thin film forming method may also be used. Further, in this embodiment, a metal film of Cu was used, but it is also possible to use a metal film of Ni, Au, Al, or other metal film in addition to Cu. The roughening of the metal film does not have to be limited to permanganic acid wet treatment. For example, plasma treatment etc. may also be used.

The advantage of this embodiment is that roughening of a metal film is easier than roughening of silicon. Further, as a secondary action in addition to the action of enhancing the mechanical bonding force by the anchor action of the roughened surface, the heat dissipating ability of the semiconductor chip is enhanced by the heat conduction of the metal film.

Fifth Embodiment

Next, an explanation will be given of an example of production of a built-in semiconductor chip multilayer circuit board using a semiconductor chip (silicon chip) treated to improve the bondability of the back surface by any of the first to fourth embodiments.

Figure 5A:
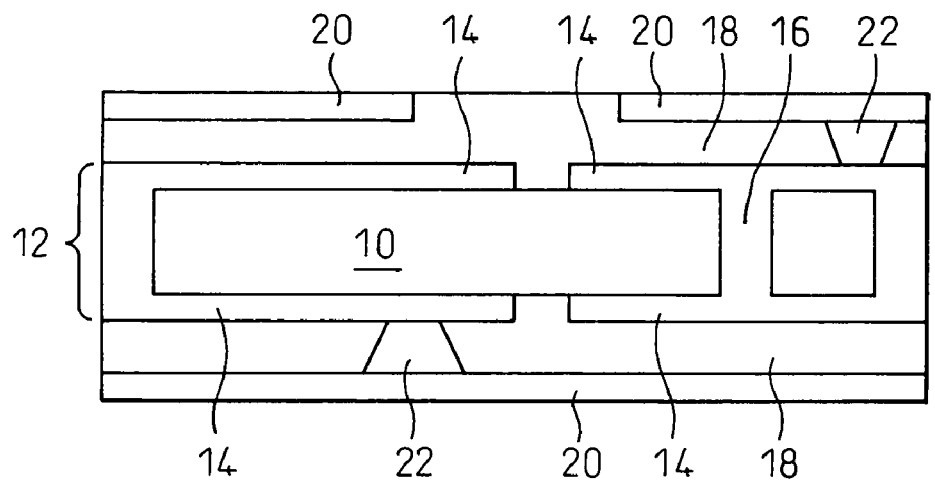
FIGS. 5A to 5N are cross-sectional views showing first to 14th steps in an example of a process of production of a built-in semiconductor chip multilayer circuit board and semiconductor module using treatment for improving bondability of the back surface of a semiconductor chip according to the present invention.

(Step 1) (FIG. 5A)

A two-sided copper clad substrate 12 comprised of a core material 10 made of an insulating resin clad on its two surfaces with copper foil is used and formed with core layer interconnect patterns 14 obtained by patterning the two copper foils, through holes 16 passing through the core material 10, insulation layers 18, interconnect patterns 20 on the insulation layers 18, and vias 22 passing through insulation layers 18 and connecting the interconnect patterns 14 and interconnect patterns 20.

Figure 5B:
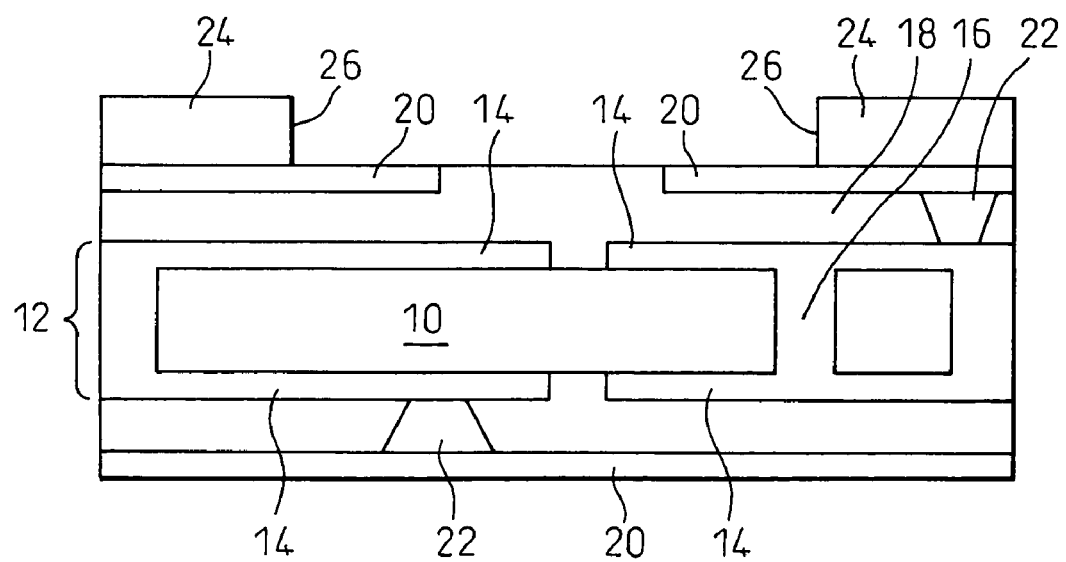

(Step 2) (FIG. 5B)

A resist layer 24 is formed on the interconnect patterns 20 and its opening 26 used to determine the chip embedding position. The opening 26 is larger than the size of the embedded chip by about 1 mm to several mm. The thickness of the resist layer 24 is made one equal to that of the thickness of the embedded chip (including the bump heights and thickness of the layer for improving bondability) (for example, about 30 to 70 μm). The resist layer 24 is formed by laminating a resist resin sheet or coating a resist resin, then performing usual lithography for patterning this by exposure and development.

Figure 5C:
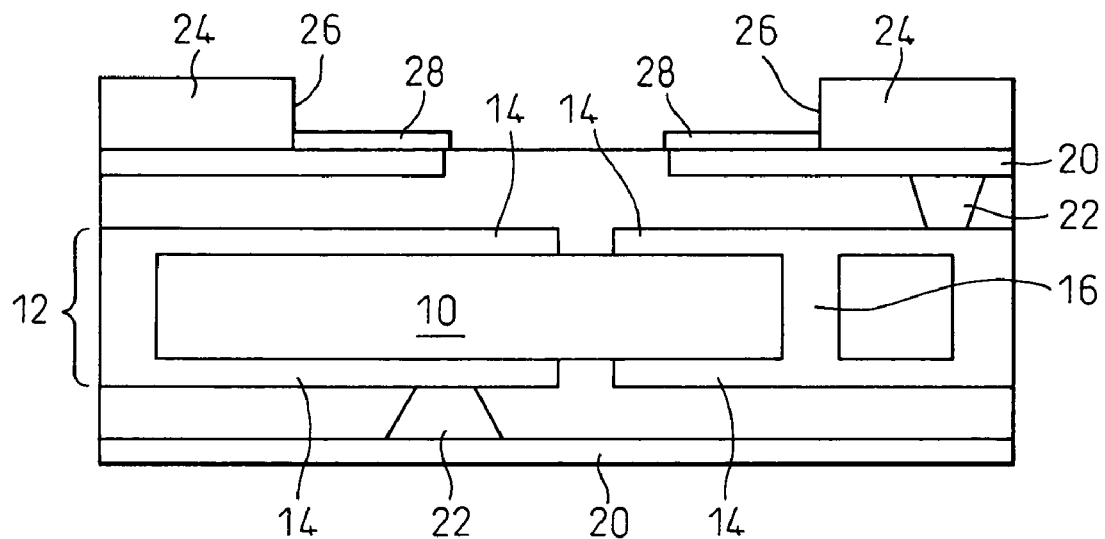

(Step 3) (FIG. 5C)

The Cu interconnect pattern 20 exposed in the opening 26 of the resist layer 24 is electrolessly plated by Au 28 to a thickness of 0.1 to 1 μm or so. Therefore, a resist resin able to withstand the electroless Au plating for formation of the resist layer 24 is selected. Electroless Au plating can handle narrow pitches of less than 150 μm.

Figure 5D:
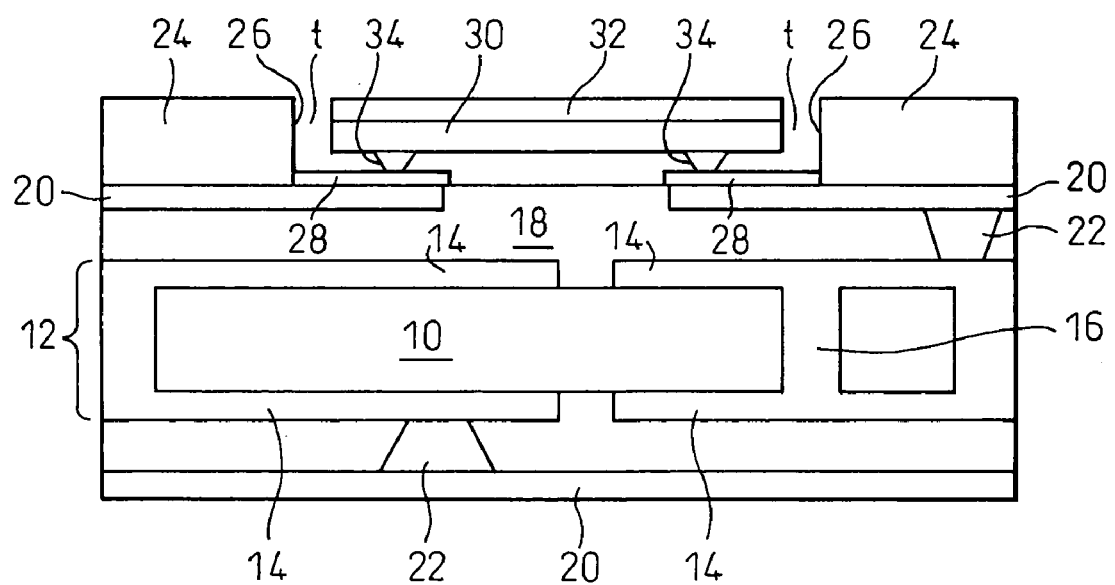

(Step 4) (FIG. 5D)

A silicon chip 30 serving as the semiconductor chip to be embedded is polished on its back surface and treated on its back surface to improve bondability by one of the methods of the first to fourth embodiments. That is, the bondability improvement layer 32 formed by this is any of the coupling agent layer 108 illustrated in the first embodiment, the bonding layer 114 illustrated in the second embodiment, the roughened surface 104R illustrated in the third embodiment, and the roughened metal film 120 illustrated in the fourth embodiment.

The active surface (lower surface in the figure) of the chip 30 is formed with Au electrode bumps 34. The thickness of the chip 30 including the height of the bumps 34 and the thickness of the bondability improvement layer 32 is about 30 to 70 μm. As explained above, this matches with the thickness of the resist layer 24. The clearance "t" between the outer circumference of the chip 30 and the side walls of the opening 26 of the resist layer 24 is about 0.5 mm to 2"mm.

Figure 5E:
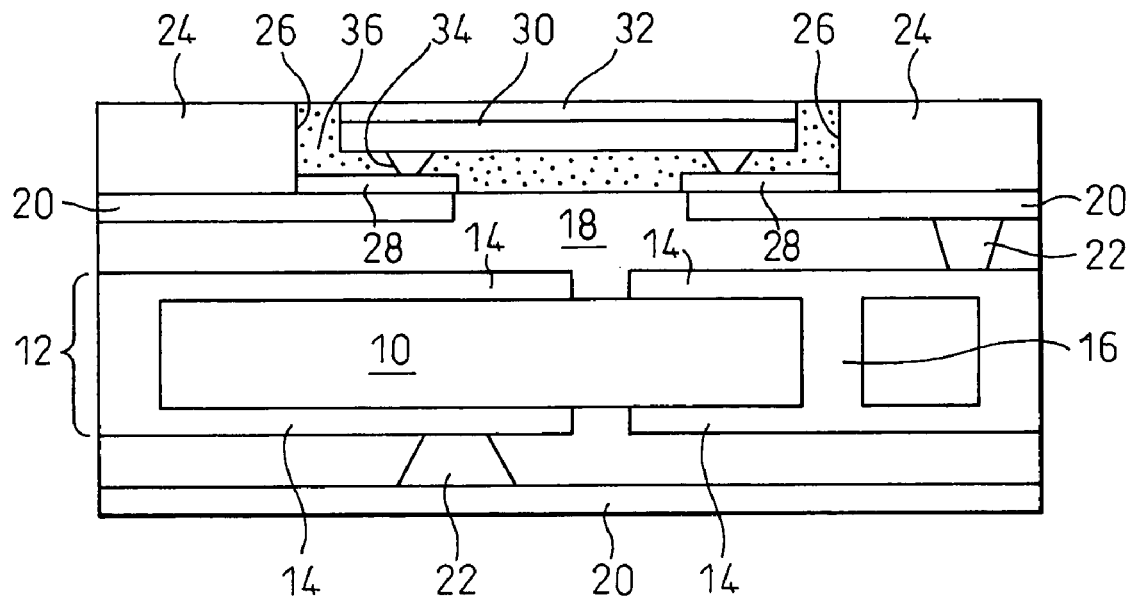

(Step 5) (FIG. 5E)

Underfill 36 is injected from the clearance "t" between the chip 30 and the opening 26 to completely fill the clearance between the chip 30 and the upper surface of the substrate and side walls of the opening 26. The upper surface of the underfill 36 is substantially in the same plane as the upper surface of the bondability improvement layer 32 and the upper surface of the resist layer 24 at the back surface of the chip 30.

Figure 5F:
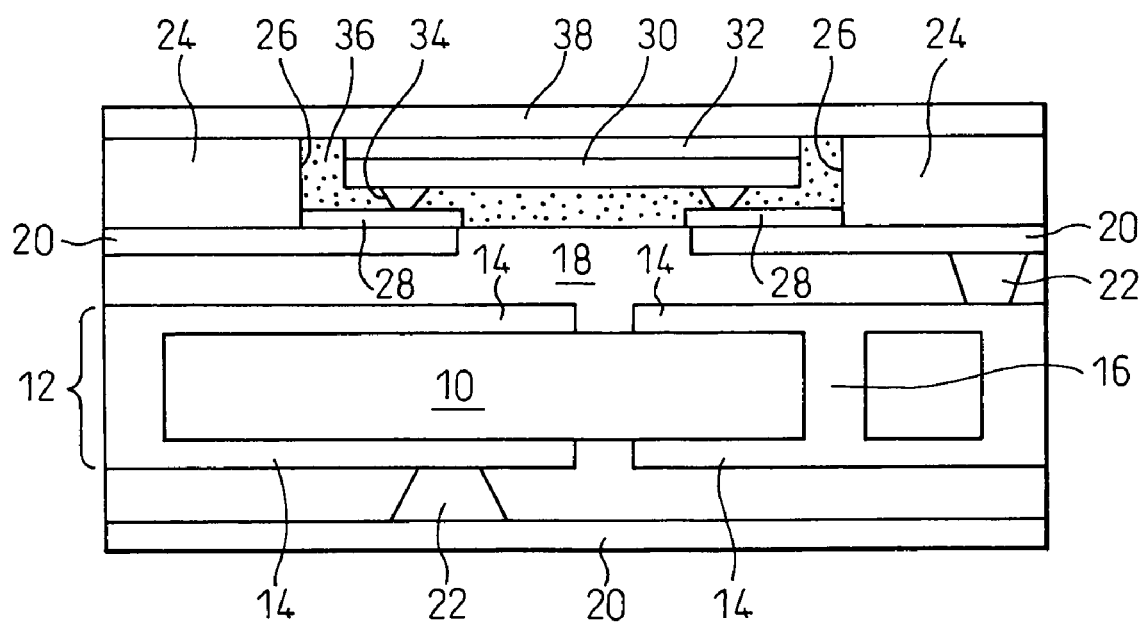

(Step 6) (FIG. 5F)

An insulation layer 38 is formed to cover all of the upper surface of the bondability improvement layer 32 of the chip 30, the upper surface of the underfill 36, and the upper surface of the resist layer 24. This is done by laminating an insulating film or spin coating a liquid insulating resin. The thickness of the insulation layer 38 is about 20 to 30 μm.

Figure 5G:
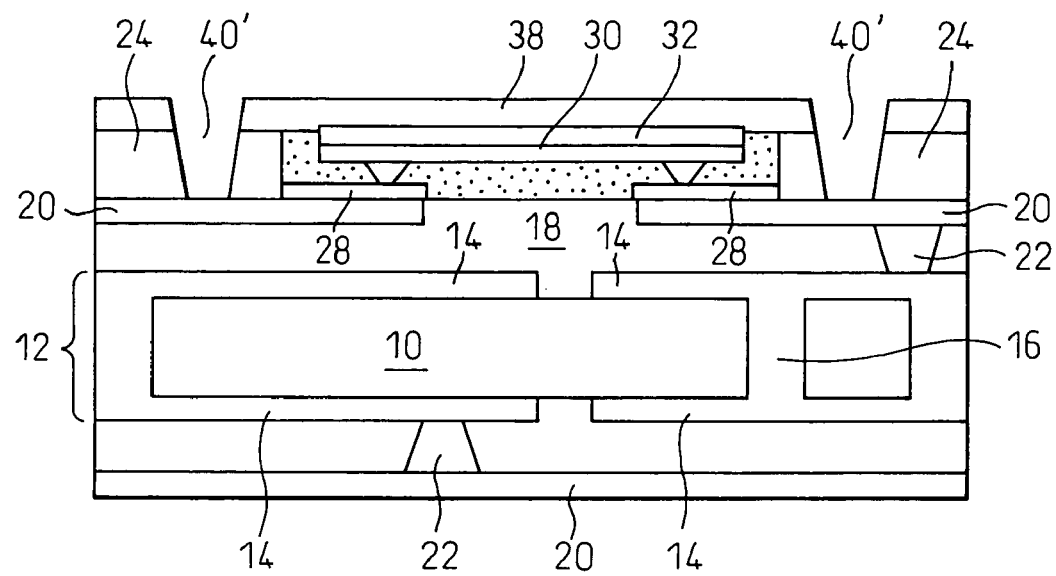

(Step 7) (FIG. 5G)

Via holes 40', are formed passing through the insulation layer 38 and the resist layer 24 underneath it and reach the interconnect pattern 20. This is performed by lasering by a YAG laser, $CO_2$ laser, etc. or by reactive ion etching (RIE).

Figure 5H:
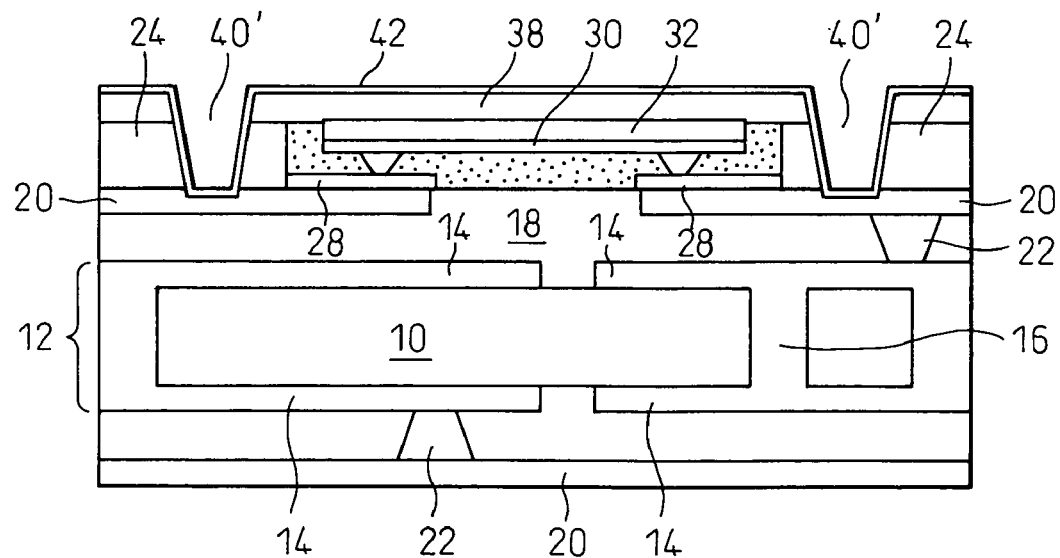

(Step 8) (FIG. 5H)

A Cu electroless plating layer 42 is formed so as to cover the entire upper surface of the insulation layer 38 and the entire inside surfaces of the via holes 40' and is made the electroplating power feed layer.

Figure 5I:
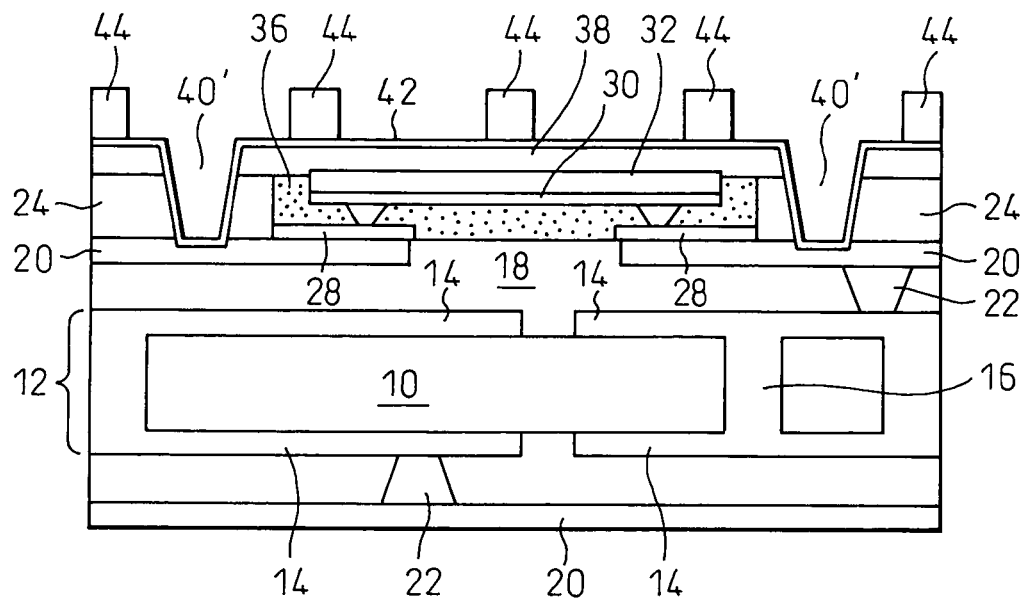

(Step 9) (FIG. 5I)

The Cu electroless plating layer 42 is formed with a resist layer 44 by ordinary lithography.

Figure 5J:
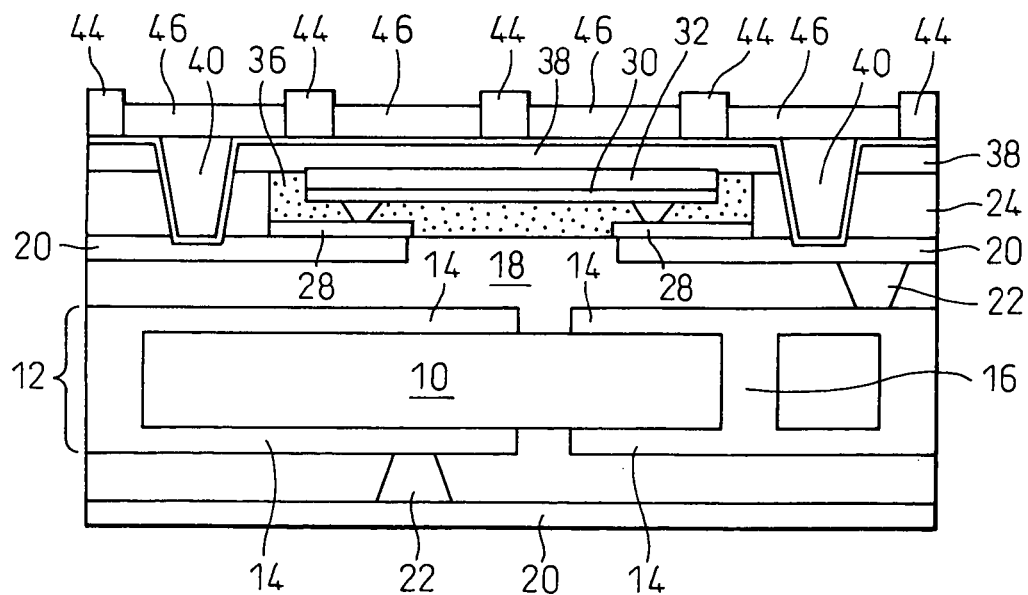

(Step 10) (FIG. 5J)

The Cu electroless plating layer 42 is used as a power feed layer for Cu electroplating to form the connection pads 46 and vias 40 all together.

Figure 5K:
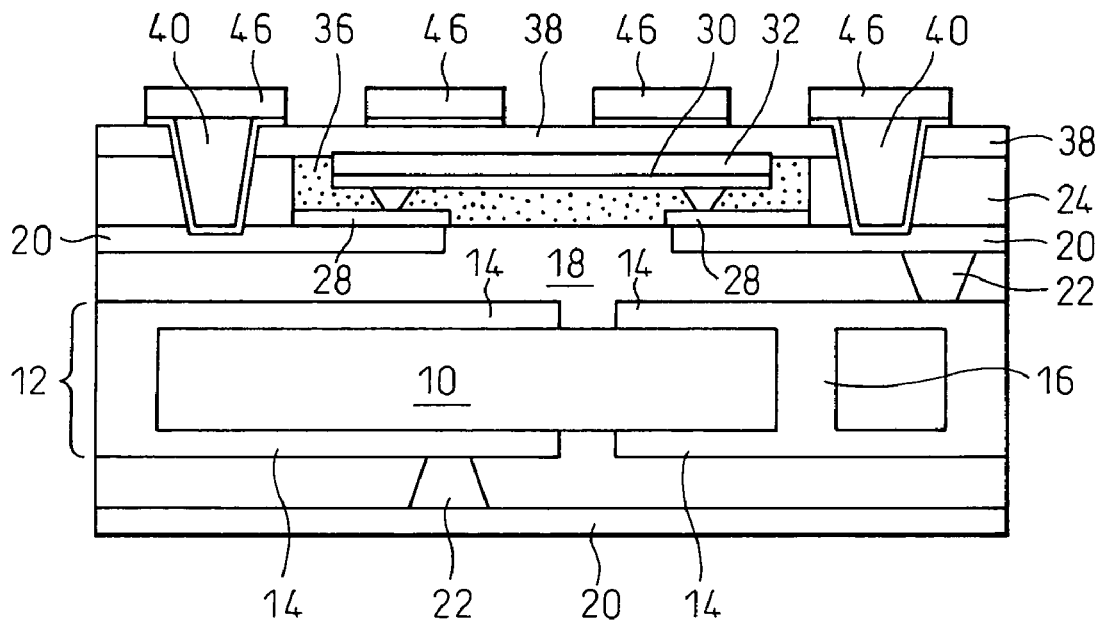

(Step 11) (FIG. 5K)

The resist layer 44 is peeled off, then the parts of the Cu electroless plating layer 42 exposed from below are removed by etching to electrically separate the individual connection pads 46.

Figure 5L:
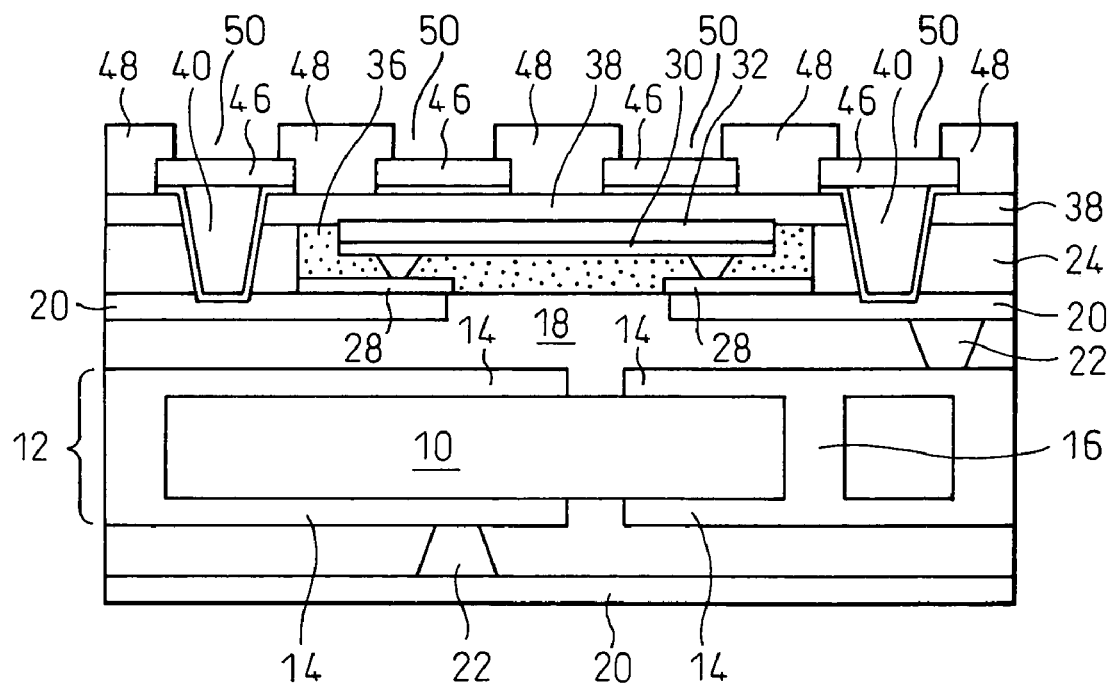

(Step 12) (FIG. 5L)

A solder resist layer 48 is formed to define the actual areas of the connection pads 46. This is formed by laminating a solder resist sheet on the entire upper surface, then exposing, development, and curing the same. Due to this, only the effective areas of the connection pads 46 are exposed from the openings 50 of the solder resist layer 48.

Figure 5M:
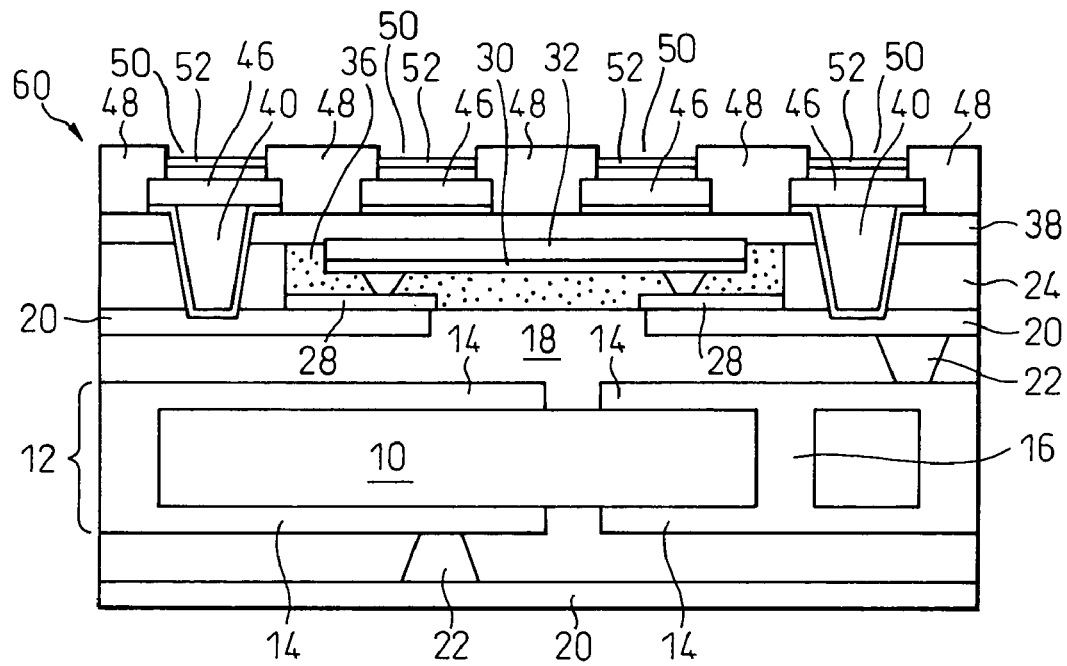

(Step 13) (FIG. 5M)

The surface of the effective region of the connection pads 46 exposed at the insides of the openings 50 of the solder resist layer 48 is covered by an Ni/Au electroless plating layer 52. Due to this, a built-in semiconductor chip type multilayer circuit board 60 is completed.

Figure 5N:
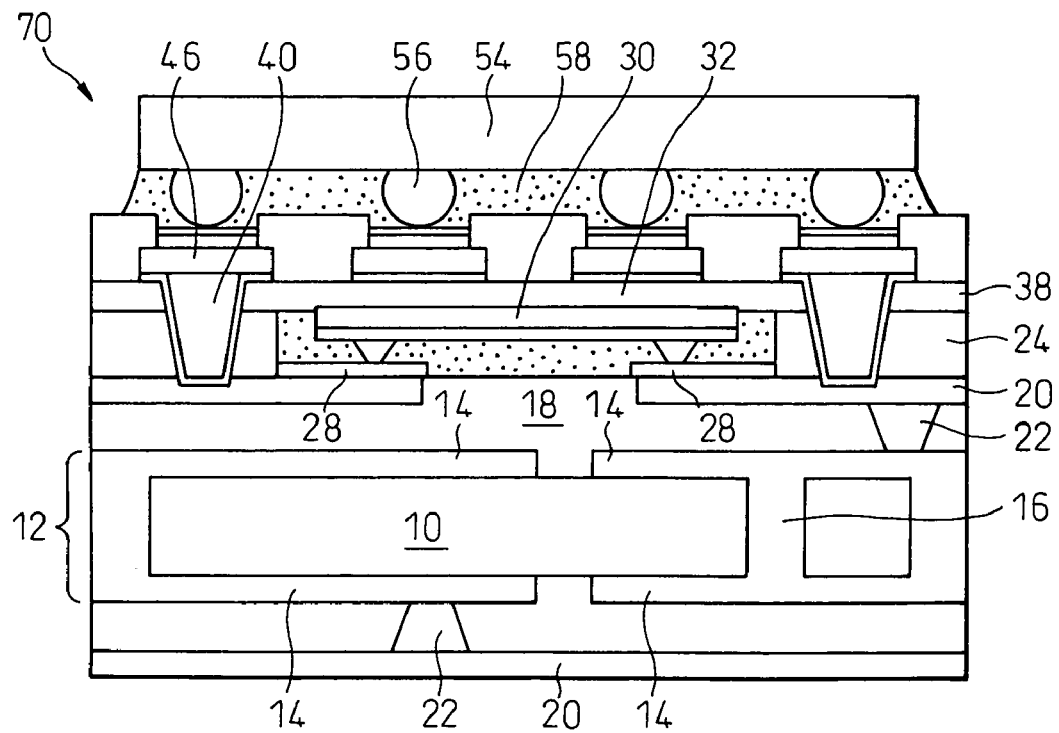

(Step 14) (FIG. 5N)

A separate silicon chip 54 is placed on the upper surface. This is done by bonding the electrode bumps 56 provided at the active surface (lower surface in the figure) of the chip 54 to the Ni/Au plating connection pads 46. After placement, underfill 58 is filled between the chip 54 and the substrate upper surface below the same. Due to this, a semiconductor module 70 comprised of a built-in semiconductor chip type multilayer circuit board 60 carrying a semiconductor chip 54 is obtained.

Summarizing the effects of the invention, according to the present invention, there is provided a method of production of a multilayer circuit board incorporating a semiconductor chip which enhances the bondability between a semiconductor chip with a smoothly polished back surface and an insulating film forming an insulation layer.

While the invention has been described with reference to specific embodiments chosen for purpose of illustration, it should be apparent that numerous modifications could be made thereto by those skilled in the art without departing from the basic concept and scope of the invention.

What is claimed is:

1. A method of production of a multilayer circuit board comprised of a multilayer structure circuit formed by a plurality of interconnect layers and insulation layers stacked together and a semiconductor chip included therein, comprising:

placing a semiconductor chip having a polished back surface, with an active surface of the semiconductor chip facing downward, on an already formed lower interconnect layer by bonding with electrode bumps of the semiconductor chip;

forming an insulation layer over the polished back surface of the semiconductor chip by laminating an insulating film thereon to produce the multilayer circuit board;

forming an opening through the insulation layer formed over the polished back surface of the semiconductor chip to expose a lower interconnect layer; and forming an interconnect layer on the insulation layer to connect to the lower interconnect layer through the opening, the method further including treating the polished back surface of the semiconductor chip to improve bondability between the semiconductor chip and the insulation layer before formation of the insulation layer, wherein the treatment for improving the bondability comprises, before said placement step, forming a metal film on the back surface of said semiconductor chip, then roughening the surface of the metal film.

* * * * *

UNITED STATES PATENT AND TRADEMARK OFFICE
CERTIFICATE OF CORRECTION

PATENT NO. : 7,134,195 B2  
APPLICATION NO. : 10/796004  
DATED : November 14, 2006  
INVENTOR(S) : Masahiro Sunohara et al.

It is certified that error appears in the above-identified patent and that said Letters Patent is hereby corrected as shown below:

Col. 3, line 4, after "etc." insert --,--

Col. 3, line 6, after "etc." insert --,--

Col. 5, line 40, after "etc." insert --,--

Col. 6, line 40, change "2"mm" to --2 mm--

Col. 6, line 60, after "40'", delete ","

Col. 6, line 63, after "etc." insert --,--

Signed and Sealed this

Twenty-seventh Day of March, 2007

JON W. DUDAS  
*Director of the United States Patent and Trademark Office*